(12) United States Patent
Sakamoto et al.

(10) Patent No.: US 6,811,635 B2
(45) Date of Patent: Nov. 2, 2004

(54) MULTILAYER CERAMIC SUBSTRATE, METHOD FOR MANUFACTURING THE SAME, AND ELECTRONIC DEVICE

(75) Inventors: Sadaaki Sakamoto, Koka-gun (JP); Hirofumi Sunahara, Moriyama (JP); Hiroshi Takagi, Otsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 152 days.

(21) Appl. No.: 09/943,389

(22) Filed: Aug. 30, 2001

(65) Prior Publication Data

US 2002/0050316 A1 May 2, 2002

(30) Foreign Application Priority Data

Sep. 7, 2000 (JP) ........................................ 2000-271321

(51) Int. Cl.[7] .............................................. B32B 31/26
(52) U.S. Cl. ................................. 156/89.16; 156/89.12
(58) Field of Search ........................... 156/89.11, 89.12, 156/89.16, 89.17, 89.18, 289; 428/210, 901

(56) References Cited

U.S. PATENT DOCUMENTS

| | | | | |
|---|---|---|---|---|
| 4,649,417 A | * | 3/1987 | Burgess et al. .............. 323/311 |
| 5,254,191 A | | 10/1993 | Mikeska et al. |
| 5,370,759 A | * | 12/1994 | Hakotani et al. .......... 156/73.1 |
| 5,387,474 A | | 2/1995 | Mikeska et al. |
| 5,456,778 A | * | 10/1995 | Fukuta et al. .............. 156/89.17 |
| 5,470,412 A | * | 11/1995 | Fukuta et al. .............. 156/89.15 |
| 5,474,741 A | | 12/1995 | Mikeska et al. |
| 5,855,711 A | * | 1/1999 | Araki et al. .............. 156/89.16 |
| 5,876,536 A | * | 3/1999 | Kumar et al. ............. 156/89.11 |
| 6,139,666 A | * | 10/2000 | Fasano et al. ................ 156/85 |
| 6,153,290 A | * | 11/2000 | Sunahara ..................... 428/210 |
| 6,228,196 B1 | * | 5/2001 | Sakamoto et al. ........ 156/89.17 |
| 6,337,123 B1 | * | 1/2002 | Ryugo et al. ............... 428/210 |
| 6,392,896 B1 | * | 5/2002 | Stoller ........................ 361/760 |
| 6,395,118 B1 | * | 5/2002 | Sakamoto et al. ........ 156/89.12 |
| 6,432,239 B1 | * | 8/2002 | Mandai et al. ........... 156/89.12 |
| 6,468,640 B2 | * | 10/2002 | Nishide et al. ............. 428/210 |

FOREIGN PATENT DOCUMENTS

| | | |
|---|---|---|
| JP | 4-243978 | 9/1992 |
| JP | 5-327218 | 12/1993 |
| JP | 9-312476 | * 12/1997 |
| JP | 11-177238 | 7/1999 |

OTHER PUBLICATIONS

Copy of Japanese Examination Report dated May 18, 2004 (and English translation of same).

* cited by examiner

Primary Examiner—Melvin C. Mayes
(74) Attorney, Agent, or Firm—Dickstein, Shapiro, Morin & Oshinsky, LLP

(57) ABSTRACT

A method for manufacturing a multilayer ceramic substrate includes a firing step wherein low-temperature-sinterable ceramic material contained in green base layers and inorganic material contained in green constraining layers chemically react each other, whereby a reaction layer is formed along an interface between the green base layer and the green constraining layer. The reaction layer acts to enhance a bonding force between the green base layer and the green constraining layer.

8 Claims, 2 Drawing Sheets

MULTILAYER CERAMIC SUBSTRATE, METHOD FOR MANUFACTURING THE SAME, AND ELECTRONIC DEVICE

BACKGROUND OF THE INVENTION

1. Field of the Invention

The present invention relates to a multilayer ceramic substrate, a method for manufacturing the same, and an electronic device including such multilayer ceramic substrate. Particularly, the present invention relates to an improvement for preventing warping which may occur in a multilayer ceramic substrate manufactured by a so-called non-shrinkage process.

2. Description of the Related Art

A multilayer ceramic substrate includes a plurality of laminated ceramic layers. Such multilayer ceramic substrate is provided with various types of wiring conductors. The wiring conductors include internal conductive films extending along predetermined interfaces between the ceramic layers inside the multilayer ceramic substrate, via-hole conductors extending to penetrate a predetermined ceramic layer, and external conductive films extending on the outer surface of the multilayer ceramic substrate.

A multilayer ceramic substrate is used for mounting thereon semiconductor chip components or other chip components and interconnecting these electronic components. The above-described wiring conductors serve as an electric path for this interconnection.

Passive components such as capacitor elements and inductor elements may be incorporated in a multilayer ceramic substrate. In this case, these passive components are provided by part of the internal conductive films and the via-hole conductors as the above-described wiring conductors.

A multilayer ceramic substrate is used as, for example, an LCR complex high-frequency component in the field of mobile communication terminal equipment. It also used as a complex component of an active element such as a semiconductor IC chip and a passive element such as a capacitor, an inductor or a resistor in the field of computers. It also used simply as a semiconductor IC package.

A multilayer ceramic substrate is widely used to constitute various electronic components such as a PA module substrate, an RF diode switch, a filter, a chip antenna, various packaged components and a composite device.

In order to achieve a multilayer ceramic substrate having further multifunctions, high-density and high-performance, it is effective to densely arrange the wiring conductors as described above.

In order to obtain a multilayer ceramic substrate, it is essential to carry out a firing step. However, shrinkage in the firing step due to sintering of the ceramic may occur. The shrinkage is not likely to occur evenly in the whole multilayer ceramic substrate, and thus undesired deformation and warping may occur in wiring conductors. Any deformation and warping in such wiring conductors inhibits high-density of the above-described wiring conductors.

The application of a so-called non-shrinkage process is suggested, wherein shrinkage in the principal surface direction of a multilayer ceramic substrate does not substantially occur during the firing step to manufacture a multilayer ceramic substrate.

In a method for manufacturing a multilayer ceramic substrate using a non-shrinkage process, a low-temperature-sinterable ceramic material which can sinter at about 1000° C. or less is prepared. Also, an inorganic material functioning to constrain shrinkage and which does not sinter at the sintering temperature of the above-described low-temperature-sinterable ceramic material is prepared. In order to prepare a green laminate which becomes a multilayer ceramic substrate by sintering, green constraining layers including the inorganic material are placed to contact a principal surface of a predetermined layer of a plurality of laminated green base layers containing the low-temperature-sinterable ceramic material, and wiring conductors are provided in association with the green base layers.

The green laminate prepared in the way described above is then fired. In the firing step, the inorganic material contained in the green constraining layers does not substantially sinter, and thus shrinkage does not substantially occur in the green constraining layers. Accordingly, the green constraining layers constrain the green base layers and as a result, the green base layers substantially shrink only in the thickness direction but shrinkage in the principal surface direction is constrained. Consequently, uneven deformation is unlikely to occur in the multilayer ceramic substrate produced by sintering the green laminate, and undesired deformation and warping is unlikely to occur in the wiring conductors. Therefore, high-density of the wiring conductors may be achieved.

However, when the bonding force between the green base layer and the green constraining layer in the above-described firing step is insufficient, the constraining force of the green constraining layers does not have sufficient effect on the green base layers, and thus sufficient shrinkage constraining effect may not be obtained. In this case, undesired deformation such as warping may occur in the produced multilayer ceramic substrate.

SUMMARY OF THE INVENTION

Accordingly, it is an object of the present invention to provide a method for manufacturing a multilayer ceramic substrate which can solve the above-described problems, a multilayer ceramic substrate produced by the method for manufacturing, and an electronic device including such multilayer ceramic substrate.

The present invention is directed to a method for manufacturing a multilayer ceramic substrate, comprising: a laminate preparing step of preparing a green laminate having a plurality of laminated green base layers containing low-temperature-sinterable ceramic material, a green constraining layer placed to contact a principal surface of a predetermined layer of the green base layers and containing inorganic material which does not sinter at the sintering temperature of the low-temperature-sinterable ceramic material, and wiring conductors provided in association with the green base layers; and a firing step of firing the green laminate at a temperature at which the low-temperature-sinterable ceramic material sinters. The present invention includes following features in order to solve the above-described technical problems.

The low-temperature-sinterable ceramic material and the inorganic material are selected so as to chemically react with each other in the firing step to form a reaction layer along an interface between the green base layer and the green constraining layer.

The above-mentioned reaction layer refers to a part wherein a component of the low-temperature-sinterable ceramic material contained in the green base layers and a component of the inorganic material contained in the green constraining layers are mixed at an atomic level. This should be distinguished from a state wherein part of the low-temperature-sinterable ceramic material contained in the green base layers is simply penetrated into the green constraining layers according to capillarity action.

In the above-described mixture at an atomic level, a new crystal phase may or may not be formed from a component contained in the low-temperature-sinterable ceramic material and a component contained in the inorganic material.

When a crystal phase is not formed, a component contained in one of the low-temperature-sinterable ceramic material and the inorganic material may diffuse, dissolve or form a solid solution in a glassy or amorphous phase, or a crystal phase included in the other of the low-temperature-sinterable ceramic material and the inorganic material.

Accordingly, the combination of low-temperature-sinterable ceramic material contained in the green base layers and inorganic material contained in the green constraining layers is important for a formation of a reaction layer.

For example, when the low-temperature-sinterable ceramic material contains borosilicate glass and the inorganic material contains at least one compound selected from the group consisting of spinel, mullite, magnesia, zirconia, zinc oxide, nickel oxide, lanthanum oxide, cobalt oxide, chromium oxide, titanium oxide, iron oxide, calcium oxide, silicon oxide, silicon carbide, boron carbide, tungsten carbide, silicon nitride and boron nitride, or when the low-temperature-sinterable ceramic material contains alumina and the inorganic material contains magnesia or cobalt oxide, a reaction layer wherein a new crystal phase is formed as described above may be formed.

On the other hand, when the low-temperature-sinterable ceramic material contains borosilicate glass and the inorganic material contains alumina powder having the particle size of about 100 nm or less, the alumina may dissolve in a glassy phase in the borosilicate glass contained in the low-temperature-sinterable ceramic material so as to form a reaction layer.

In order to ensure formation of the reaction layer applying the present invention, it is preferable that a programming rate (temperature increase rate) is about 15° C./min. or less and a hold time at the maximum temperature is more than about 10 minutes or more in the firing step.

When the green constraining layer included in the green laminate prepared by the laminate preparing step is placed at each end in the laminating direction of the laminate, it is preferable that at least part of the reaction layer and the green constraining layers are removed after the firing step.

The method for manufacturing a multilayer ceramic substrate according to the present invention may further comprise a step of mounting electronic components on the outer surface of the laminate after the firing step.

The present invention is also directed to a multilayer ceramic substrate produced by the method for manufacturing as described above.

The present invention is also directed to an electronic device including the above-described multilayer ceramic substrate and a motherboard for mounting the multilayer ceramic substrate.

According to the present invention, following advantages will be provided.

In manufacture of a multilayer ceramic substrate using a so-called non-shrinkage process, low-temperature-sinterable ceramic material contained in green base layers and inorganic material contained in green constraining layers chemically react each other during the firing step. In the firing step, a reaction layer is generated by a chemical reaction of the low-temperature-sinterable ceramic material and the inorganic material and is formed along an interface between the green base layer and the green constraining layer. The reaction layer may act to enhance a bonding force between the green base layer and the green constraining layer.

Accordingly, the constraining force of the green constraining layers acts sufficiently on the green base layers in the firing step and the green constraining layers have an excellent shrinkage constraining effect on the green base layers. As a result, shrinkage in the principal surface direction of the green base layers is sufficiently constrained, and thus undesired deformation such as warping may be unlikely to occur in a produced multilayer ceramic substrate.

Therefore, a multilayer ceramic substrate which is small-sized and having high-density in wiring may be produced with enhanced reliability.

In the present invention, when a programming rate in a firing step is about 15° C./min. or less, the possibility of forming the above-described reaction layer becomes higher.

Also, when a hold time at the maximum temperature in a firing step is about 10 minutes or more, the possibility of forming the reaction layer becomes higher.

When an electronic device is constituted by mounting a multilayer ceramic substrate produced by the manufacturing method according to the present invention on a motherboard, miniaturization and high-density in wiring of the multilayer ceramic substrate are achieved, and deformation such as warping is not likely to occur, as described above. Therefore, the miniaturization and multifunction of such electronic device may advantageously be achieved. In addition, reliability to a connection between the multilayer ceramic substrate and the motherboard in the electronic device may be increased.

Further objects, features, and advantages of the present invention will be apparent from the following description of the preferred embodiments with reference to the attached drawings.

DESCRIPTION OF THE PREFERRED EMBODIMENT

Figure 1:
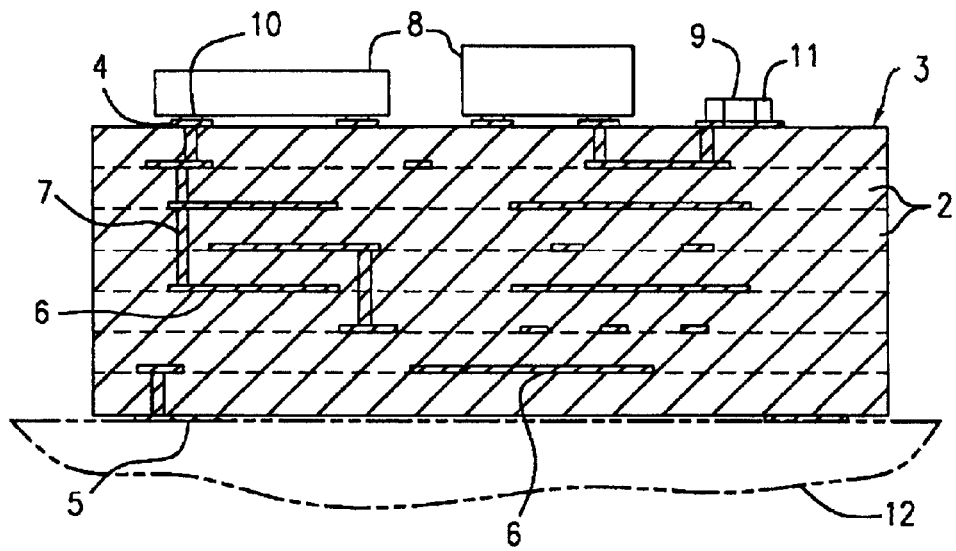
FIG. 1 is a sectional view schematically illustrating a multilayer ceramic substrate 1 according to an embodiment of the present invention.

FIG. 1 is a sectional view schematically illustrating a multilayer ceramic substrate 1 according to an embodiment of the present invention. The multilayer ceramic substrate 1 shown in FIG. 1 constitutes a ceramic multilayer module.

The multilayer ceramic substrate 1 includes a laminate 3 having a plurality of laminated ceramic layers 2. In the laminate 3, various wiring conductors are provided in association with the ceramic layers 2.

The above-mentioned wiring conductors include external conductive films 4 and 5 formed on the end faces in the laminating direction of the laminate 3, internal conductive films 6 formed along an interface between the ceramic layers 2, and via-hole conductors 7 penetrating a predetermined layer of the ceramic layers 2.

The above-mentioned external conductive films 4 are used to connect electronic components 8 and 9 to an outer surface of the laminate 3. Illustrated in FIG. 1 are the electronic components 8, such as a semiconductor device, having bump electrodes 10, and the electronic component 9, such as a chip capacitor, having sheet-like terminal electrodes 11.

The electronic components 8 are bonded to the external conductive films 4 via the bump electrodes 10 by performing a reflow soldering step, an ultrasonic wave applying step or a thermocompression bonding step to the bump electrodes 10. On the other hand, the electronic component 9 is mounted on the laminate 3 by bonding the terminal electrodes 11 to the external conductive film 4 by using, for example, solder or conductive adhesive, in a manner that the terminal electrodes 11 face the external conductive film 4.

The external conductive films 5 are used to connect the multilayer ceramic substrate 1 to a motherboard 12, as indicated by an imaginary line in FIG. 1. That is, the multilayer ceramic substrate 1 is mounted on the motherboard 12 in a manner that the multilayer ceramic substrate 1 is electrically connected to the motherboard 12 via the external conductive films 5, so as to constitute a desired electronic device.

Figure 2:
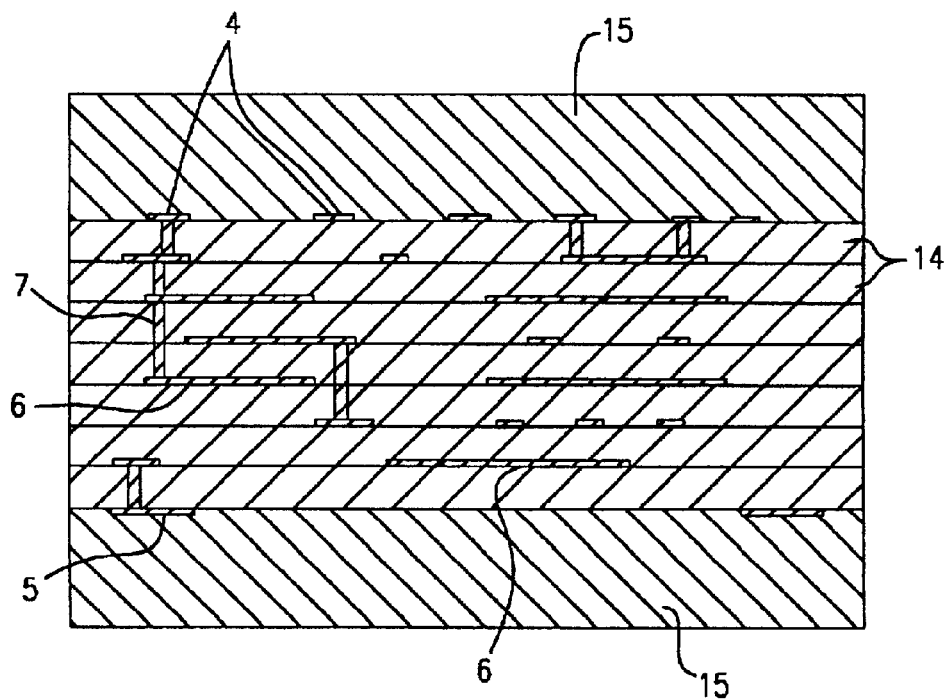
FIG. 2 is a sectional view schematically illustrating a green laminate 13 prepared to produce a laminate 3 shown in FIG. 1.

The laminate 3 included in the multilayer ceramic substrate 1 shown in FIG. 1 is produced by firing a green laminate 13 as shown in FIG. 2.

The green laminate 13 includes a plurality of laminated green base layers 14 which are to be the above-described ceramic layers 2. The green base layers 14 contain low-temperature-sinterable ceramic material.

The aforementioned low-temperature-sinterable ceramic material contains a ceramic powder and a glass component. As the ceramic powder, alumina powder is used for example. The glass component may be originally contained in the low-temperature-sinterable ceramic material as glass powder or may be a material that precipitates glassy matter in a firing step. As the glass component, borosilicate glass may be advantageously used.

The green laminate 13 also includes green constraining layers 15 arranged to contact a principal surface of a predetermined layer of the green base layers 14. The green constraining layers 15 contain an inorganic material which does not sinter at the sintering temperature of the above-described low-temperature-sinterable ceramic material. In this embodiment, the green constraining layer 15 is placed at each end in the laminating direction of the green laminate 13.

The low-temperature-sinterable ceramic material contained in the above-described green base layers 14 and inorganic material contained in the green constraining layers 15 are selected so as to such materials chemically react each other during firing.

A chemical reaction herein means that a component contained in the low-temperature-sinterable ceramic material and a component contained in the inorganic material are mixed at an atomic level. In the mixing at an atomic level, a new crystal phase may or may not be formed from a component contained in the low-temperature-sinterable ceramic material and a component contained in the inorganic material. When a crystal phase is not formed, a component contained in one of the low-temperature-sinterable ceramic material and the inorganic material may diffuse, dissolve or form a solid solution in a glassy or amorphous phase, or a crystal phase included in the other of the low-temperature-sinterable ceramic material and the inorganic material.

For example, when borosilicate glass is used as the low-temperature-sinterable ceramic material, and magnesia or zirconia is used as the inorganic material, $MgSiO_3$ or $ZrSiO_4$ is likely to be generated as a result of a chemical reaction. Also, when borosilicate glass is used as the low-temperature-sinterable ceramic material, and at least one compound selected from the group consisting of spinel, mullite, zinc oxide, nickel oxide, lanthanum oxide, cobalt oxide, chromium oxide, titanium oxide, iron oxide, calcium oxide, silicon oxide, silicon carbide, boron carbide, tungsten carbide, silicon nitride and boron nitride are used as the inorganic material, a chemical reaction of these compounds may form a new crystal phase. In addition, when alumina is used as the low-temperature-sinterable ceramic material and magnesia or cobalt oxide is used as the inorganic material, the above-mentioned chemical reaction generates a reactant having a Spinel structure.

When borosilicate glass is used as the low-temperature-sinterable ceramic material and alumina is used as the inorganic material, reactivity between these materials is generally poor. However, by reducing alumina to powder having very small particle size, for example, about 100 nm or less, the alumina is allowed to dissolve into a glassy phase included in the low-temperature-sinterable ceramic material.

The green laminate 13 further includes wiring conductors provided in association with the green base layers 14. The wiring conductors include, as described above, the external conductive films 4 and 5, the internal conductive films 6, and the via-hole conductors 7.

In order to prepare such green laminate 13, following steps are carried out, for example.

First, in order to prepare the green base layers 14, binder, dispersant, plasticizer, organic solvent and so on, are added to mixed powder prepared by mixing ceramic powder and glass powder, and then mixed so as to prepare ceramic slurry. Next, the ceramic slurry is formed to be sheets by the doctor blade method to prepare green sheets for the base ceramic, which are to be the green base layers 14.

Next, through holes are provided if necessary to form the via-hole conductors 7 in the prepared green sheets for base ceramic. The via-hole conductors 7 are formed by filling the through holes with conductive paste or conductive powder. Also, the external conductive films 4 and 5 and the internal conductive films 6 are formed if necessary, by printing, for example, a silver conductive paste on the green sheets for base ceramic.

These green sheets for base ceramic are laminated in a predetermined order.

In order to prepare the green constraining layers 15, inorganic slurry is prepared by adding binder, dispersant, plasticizer, organic solvent and so on, to an inorganic powder which may chemically react with the low-temperature-sinterable ceramic material and by mixing them. Then, the inorganic slurry is formed to be sheets by the doctor blade method to prepare green sheets for constraining ceramic which are to be the green constraining layers 15.

Next, the green sheet for constraining ceramic is laminated on each end face in the laminating direction of the laminated green sheets for base ceramic, and then pressed. Accordingly, the green laminate 13 shown in FIG. 2 may be prepared. If necessary, the green laminate 13 may be cut into a suitable size.

Figure 3:
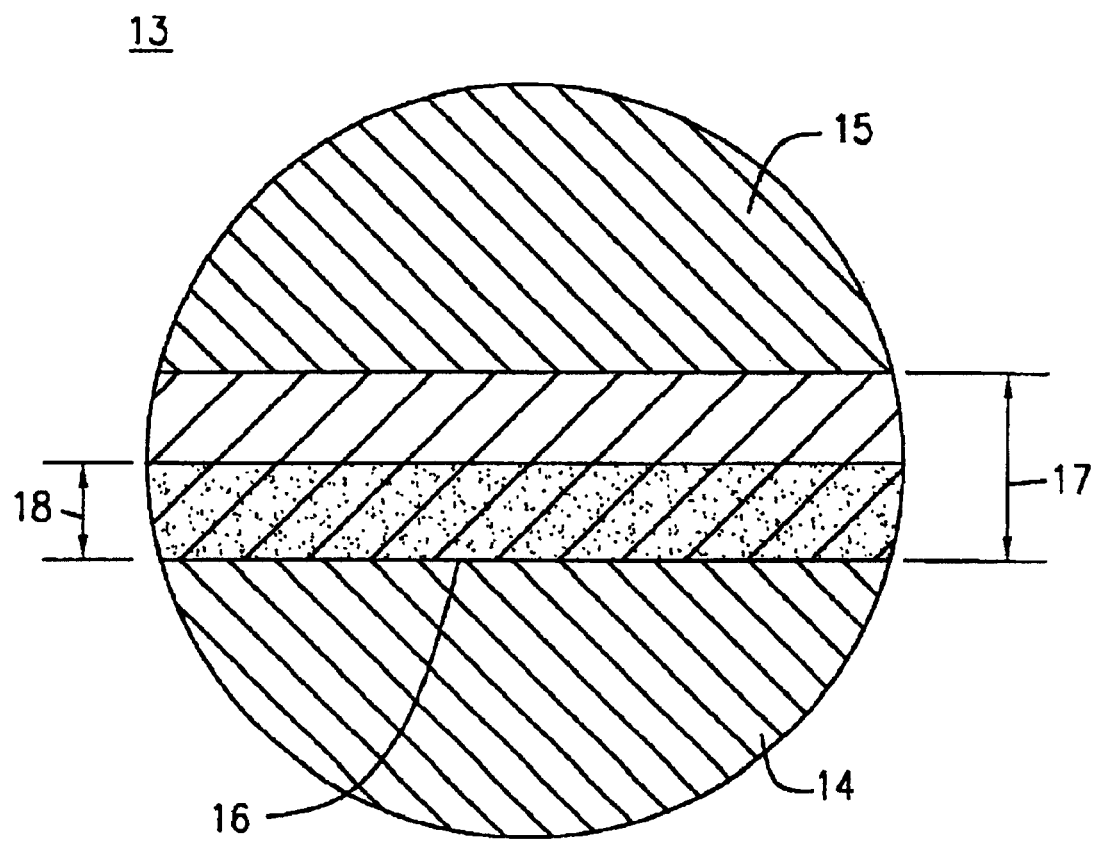
FIG. 3 is a sectional view schematically illustrating part of the green laminate 13 shown in FIG. 2 at a greater scale.

Subsequently, the green laminate 13 is fired at about 800 to 1000° C., for example. In this firing step, the green constraining layers 15 themselves do not shrink substantially. The low-temperature-sinterable ceramic material contained in the green base layers 14 and the inorganic material contained in the green constraining layers 15 chemically react, and as a result, a reaction layer 17 is generated and formed along the interface 16 between the green base layer 14 and the green constraining layer 15, as shown in FIG. 3 at a greater scale. The reaction layer 17 enhances the bonding force between the green base layer 14 and the green constraining layer 15.

Accordingly, a constraining force of the green constraining layers 15 acts sufficiently on the green base layers 14. Due to the constraining force of the green constraining layers 15 against the green base layers 14, shrinkage in the principal surface direction of the green base layers 14 is constrained and at the same time, the low-temperature-sinterable ceramic material contained in the green base layers 14 is sintered. In this way, the green base layers 14 shrink substantially only in the thickness direction, and the ceramic layers 2 included in the laminate 3 in the multilayer ceramic substrate 1 are formed.

In an enlarged sectional view shown in FIG. 3, the interface 16 and the borderline between the reaction layer 17 and the other area are indicated by straight lines. These are for a simple illustration and actually these lines are bumpy due to an aggregation of ceramic powder and inorganic powder.

The above-described reaction layer 17 is formed to have the thickness of about 5 µm or less, for example. In FIG. 3, a penetration layer 18 formed along the interface 16 and to have the thickness of, for example, about 2 to 3 µm is shown. The penetration layer 18 is formed by following order: in a firing step, the glass component is softened in the green base layers 14, and then the softened glass component penetrates into the green constraining layers 15, based on capillarity action. That is, the penetration layer 18 is formed by a so-called physical action, and should be distinguished from the above-described reaction layer 17, which is formed by a chemical action.

In order to ensure a formation of the reaction layer 17, it is preferable to control a sintering profile. For example, the slower the programming rate in a firing step, the higher the possibility of forming the reaction layer 17. The programming rate is preferably about 15° C./min. or less.

In a firing step, it is preferable that a hold time at the maximum temperature lasts about 10 minutes or more, and more preferably, about 30 to 60 minutes. If the hold time lasts more than about 60 minutes, glass component may appear at the surface of the sintered laminate 3.

After the above-described firing step, the green constraining layers 15 and at least part of the reaction layer 17 are removed. Since the green constraining layers 15 are not sintered, the green constraining layers 15 and the reaction layer 17 may be easily removed.

In this way, the laminate 3 in the multilayer ceramic substrate 1 shown in FIG. 1 is produced. By mounting the electronic components 8 and 9 on the outer surface of the laminate 3, the multilayer ceramic substrate 1 as shown in FIG. 1 is achieved.

In the above-described embodiment, the green constraining layer 15 is placed at each end in the laminating direction of the green laminate 13. However, a green constraining layer may be placed between green base layers 14 instead of or in addition to the green constraining layers 15. In this case, part of glass component and so on contained in the green base layers 14 penetrates, in the firing step, into the green constraining layer between the green base layers 14. As a result, the inorganic powder contained in the green constraining layer is bound so that the green constraining layer becomes solid. Such green constraining layer is not removed after firing and exists in a laminate included in a multilayer ceramic substrate which is to be a product.

Hereinafter, Examples carried out to confirm effects of the formation of the above-described reaction layer 17 will be explained.

In this example, a green laminate 13 was prepared and fired to produce a sintered laminate 3, according to the method for manufacturing described above with reference to FIGS. 1 to 3.

As low-temperature-sinterable ceramic material contained in green base layers 14, a mixture of glass powder having various glass component compositions as shown in Table 1 and alumina powder was used. Here, glass powder having average particle size of 1.5 µm and specific surface of 4 $m^2/g$ was used.

As inorganic material contained in green constraining layers 15, various types of ceramic powder as shown in Table 1 was used. Here, ceramic powder having average particle size of 2 µm and specific surface of 2 $m^2/g$ was used.

Regarding each sample thereby prepared, the presence of a reaction layer 17 in an interface 16 between the green base layer 14 and the green constraining layer 15 after a firing of the green laminate 13 was confirmed by observing with a scanning electron microscope. Also, regarding each sample, the shrinkage ratio at a firing and warp amount in 10×10 cm area were found. The result is shown in Table 1.

TABLE 1

| Sample No. | Glass component in green base layers | Inorganic material in green constraining layers | Reaction layer | Shrinkage ratio (%) | Warp amount (µm) |
|---|---|---|---|---|---|
| 1* | Si-B-O | $Al_2O_3$ | not formed | 0.20 | 300 |
| 2* | Si-B-O | $ZrO_2$ | not formed | 0.05 | 200 |
| 3 | Si-B-Ca | $ZrO_2$ | formed | 0.05 | 100 |
| 4 | Si-B-Mg | $ZrO_2$ | formed | 0.05 | 100 |
| 5 | Si-B-Sr | $ZrO_2$ | formed | 0.05 | 100 |
| 6 | Si-B-Ba | $ZrO_2$ | formed | 0.05 | 100 |
| 7 | Si-B-O | $MgAl_2O_4$ | formed | 0.05 | 100 |
| 8 | Si-B-Ca | $MgAl_2O_4$ | formed | 0.05 | 100 |
| 9 | Si-B-Mg | $MgAl_2O_4$ | formed | 0.05 | 100 |
| 10 | Si-B-Sr | $MgAl_2O_4$ | formed | 0.05 | 100 |
| 11 | Si-B-Ba | $MgAl_2O_4$ | formed | 0.05 | 100 |
| 12 | Si-B-O | MgO | formed | 0.05 | 100 |
| 13 | Si-B-Ca | MgO | formed | 0.05 | 100 |
| 14 | Si-B-Mg | MgO | formed | 0.05 | 100 |
| 15 | Si-B-Sr | MgO | formed | 0.05 | 100 |
| 16 | Si-B-Ba | MgO | formed | 0.05 | 100 |
| 17 | Si-B-O | $SiO_2$ | formed | 0.05 | 100 |
| 18 | Si-B-Ca | $SiO_2$ | formed | 0.05 | 100 |
| 19 | Si-B-Mg | $SiO_2$ | formed | 0.05 | 100 |
| 20 | Si-B-Sr | $SiO_2$ | formed | 0.05 | 100 |
| 21 | Si-B-Ba | $SiO_2$ | formed | 0.05 | 100 |
| 22 | Si-B-O | $3Al_2O_3 \cdot 2SiO_2$ | formed | 0.05 | 100 |
| 23 | Si-B-Ca | $3Al_2O_3 \cdot 2SiO_2$ | formed | 0.05 | 100 |
| 24 | Si-B-Mg | $3Al_2O_3 \cdot 2SiO_2$ | formed | 0.05 | 100 |
| 25 | Si-B-Sr | $3Al_2O_3 \cdot 2SiO_2$ | formed | 0.05 | 100 |

TABLE 1-continued

| Sample No. | Glass component in green base layers | Inorganic material in green constraining layers | Reaction layer | Shrinkage ratio (%) | Warp amount (μm) |
|---|---|---|---|---|---|
| 26 | SI-B-Ba | 3Al$_2$O$_3$ 2SiO$_2$ | formed | 0.05 | 100 |
| 27 | Si-B-O | La$_2$O$_3$ | formed | 0.05 | 100 |
| 28 | Si-B-Ca | La$_2$O$_3$ | formed | 0.05 | 100 |
| 29 | Si-B-Mg | La$_2$O$_3$ | formed | 0.05 | 100 |
| 30 | Si-B-Sr | La$_2$O$_3$ | formed | 0.05 | 100 |
| 31 | Si-B-Ba | La$_2$O$_3$ | formed | 0.05 | 100 |

In Table 1, the sample numbers with * correspond to comparative examples out of the scope of this invention.

With reference to Table 1, where each of the samples 3 to 31 was used, a reaction layer was formed and shrinkage ratio and warp amount were smaller than those in cases where sample 1 or 2 was used and a reaction layer was not formed. Thus, it is apparent that the green constraining layers 15 have an excellent shrinkage constraining effect on the green base layers 14.

What is claimed is:

1. A method for manufacturing a multilayer ceramic substrate comprising:

providing a green laminate having a plurality of laminated green base layers containing a low-temperature-sinterable ceramic material including a glass component, a green constraining layer disposed to contact a principal surface of at least one layer of said green base layers and containing an inorganic material which does not sinter at the sintering temperature of said low-temperature-sinterable ceramic material, and at least one wiring conductor disposed in association with said green base layers; and firing said green laminate at a sintering profile at which said low-temperature-sinterable ceramic material sinters, wherein said sintering profile, said low-temperature-sinterable ceramic material and said inorganic material are selected such that a reaction layer and a penetration layer are formed along an interface between the green base layer and the green constraining layer, in which the reaction layer is formed by a chemical reaction of the low-temperature-sinterable ceramic material and the inorganic material and the penetration layer is formed by penetration of the glass component into the green constraining layer without a chemical reaction, wherein said low-temperature-sinterable ceramic material and said inorganic material chemically react with each other during said firing step such that a component contained in one of said low-temperature-sinterable ceramic material and said inorganic material diffuses, dissolves or forms a solid solution in a glassy or amorphous phase or a crystal phase included in the other of said low-temperature-sinterable ceramic material and said inorganic material, and wherein said low-temperature-sinterable ceramic material comprises borosilicate glass, and said inorganic material comprises alumina powder having a particle size of about 100 nm or less.

2. The method for manufacturing a multilayer ceramic substrate according to claim 1, wherein the temperature is raised at about 15° C./min. or less during said firing.

3. The method for manufacturing a multilayer ceramic substrate according to claim 2, wherein the maximum temperature achieved during said firing is maintained for at least about 10 minutes.

4. The method for manufacturing a multilayer ceramic substrate according to claim 3, wherein the maximum temperature achieved during said firing is maintained for about 30 to 60 minutes.

5. The method for manufacturing a multilayer ceramic substrate according to claim 4, further comprising forming said green laminate.

6. The method for manufacturing a multilayer ceramic substrate according to claim 1, wherein said laminate has a green constraining layer at each end in the laminating direction of said laminate, and said method further comprises removing, after said firing step, at least part of said reaction layer and said green constraining layer at each end in the laminating direction of said laminate.

7. The method for manufacturing a multilayer ceramic substrate according to claim 6, further comprising mounting at least one electronic component on an outer surface of the laminate after said firing.

8. The method for manufacturing a multilayer ceramic substrate according to claim 7, further comprising forming said green laminate.

* * * * *